(12) United States Patent
Lien et al.

(10) Patent No.: US 7,138,704 B2
(45) Date of Patent: Nov. 21, 2006

(54) CONCEALABLE CHIP LEADFRAME UNIT STRUCTURE

(75) Inventors: Jeffrey Lien, Taipei (TW); Yuan Sheng Cheng, Zhonghe (TW)

(73) Assignee: Optimum Care International Tech. Inc., Taipei (TW)

( * ) Notice: Subject to any disclaimer, the term of this patent is extended or adjusted under 35 U.S.C. 154(b) by 0 days.

(21) Appl. No.: 10/959,207

(22) Filed: Oct. 7, 2004

(65) Prior Publication Data
US 2005/0156290 A1  Jul. 21, 2005

(30) Foreign Application Priority Data
Jan. 14, 2004  (TW) .............................. 93200673 U

(51) Int. Cl.
*H01L 23/48* (2006.01)

(52) U.S. Cl. ...................................... 257/666; 257/692

(58) Field of Classification Search ................ 257/666, 257/673, 692
See application file for complete search history.

(56) References Cited

U.S. PATENT DOCUMENTS 3,550,228 A * 12/1970 Asscher ...................... 29/25.42
5,307,929 A * 5/1994 Seidler ........................ 257/676
6,091,134 A * 7/2000 Sakamoto et al. .......... 257/666

* cited by examiner

*Primary Examiner*—Roy Potter
(74) *Attorney, Agent, or Firm*—Troxell Law Office, PLLC

(57) ABSTRACT

A concealable chip leadframe unit structure is disclosed which is made up of multiple lead units arranged in order, each lead in the lead unit is formed by pressing and comprising of a piece body with upper placement plane, the lower surface of the piece body is pressed to form at least an inner conducting plane which can be connected to the chip, and at least one protruding bump is formed adjacent to the inner conducting plane, the end surface of the protruding bump is used as an out-conducting plane to be connected to outside; in this structure, chip can be attached to the upper placement plane of the lead structure, and the inner conducting plane can be connected to the chip through metallic wire.

8 Claims, 5 Drawing Sheets

CONCEALABLE CHIP LEADFRAME UNIT STRUCTURE

BACKGROUND OF THE INVENTION

1. Field of the Invention

This invention is related to the structure and design of a concealable chip leadframe unit, it is more specifically related to the structure and design of a chip leadframe unit which is capable of been placed underneath the chip and been reduced in the leadframe volume.

2. Description of the Related Art

One of the major concern in the printed circuit board layout is how to fully use the limited area in a printed circuit board, especially when the information and electronic products nowadays move toward the trend of multi-function design, how to install more functional transistors possible in the limited printed circuit board space is the major technical bottleneck to be overcome; in addition, the electronic products nowadays, especially personal portable products such as: personal digital assistant (PDA), Note Book, multi-function portable disc, tablet PC, system or cellular phone, etc., have focused on providing portable convenience for the users and thus headed toward smaller volume and compact design, therefore, in addition to reduce the printed circuit board size, the improvement on the structure and design of other electronic components is also indispensable.

As shown in FIGS. 9 and 10, it is a prior art semiconductor packaging structure wherein leadframe 30 is installed underneath chip 20 in the conventional semiconductor package 10, an encapsulated body 40 is used to enclose and seal the whole structure, leadframe 30 is used as a media to connect chip 20 to the printed circuit board, the leadframe 30 comprising of multiple rows of leads 301 protruding along the lower two sides of semiconductor package 10, not only the volume of leadframe 30 in this structure is difficult to be reduced, but also the electrical resistance stays high, therefore, with this structure, it is difficult to meet the trend of compact and high speed printed circuit board and electronic components.

SUMMARY OF THE INVENTION

The main purpose of this invention is to provide a concealable chip leadframe unit structure and design, it is to use an inventive leadframe design to eliminate the bulky problem of conventional semiconductor package 10, leadframe can be placed underneath the chip and its volume can be greatly reduced and the transfer speed can be greatly enhanced.

This invention is a chip leadframe comprising multiple leads unit arranged in rows with the following features: leads are formed by pressing method and are a piece body comprising an upper placement plane, under the lower surface of the piece body is formed with at least one inner conducting plane which can be connected to the chip by pressing method, and at least one downward protruding bump adjacent to the inner conducting surface, the end surface of the protruding bump can thus be used as an out-conducting plane to be connected to outside; a leadframe leads structure is thus formed wherein chip can be placed on the upper placement plane of the leads, and the inner conducting plane can be connected to chip by metallic wire, furthermore, the end surface of the protruding bump can be used to be soldered to printed circuit board, and the goal of concealable leadframe and volume reduction is thus achieved.

Yet another purpose of the current invention is to provide a structure and design of a concealable chip leadframe unit wherein the structure of leads is formed from metal block by pressing method, or other methods such as bending and folding are used to form a structure of similar function.

DETAILED DESCRIPTION OF THE INVENTION

Figure 1:
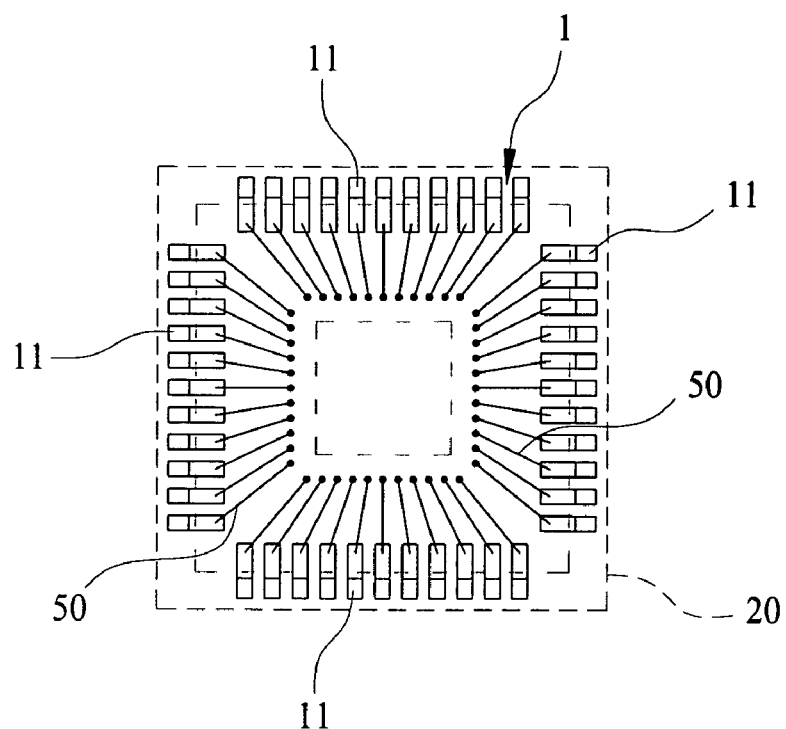
FIG. 1 is a leadframe embodiment of the current invention with four rows of leads.
Figure 2:
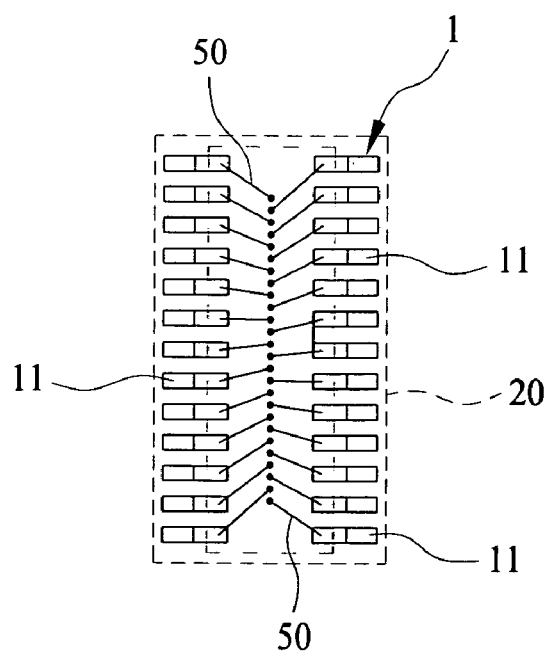
FIG. 2 is a leadframe embodiment of the current invention with two rows of leads.
Figure 3:
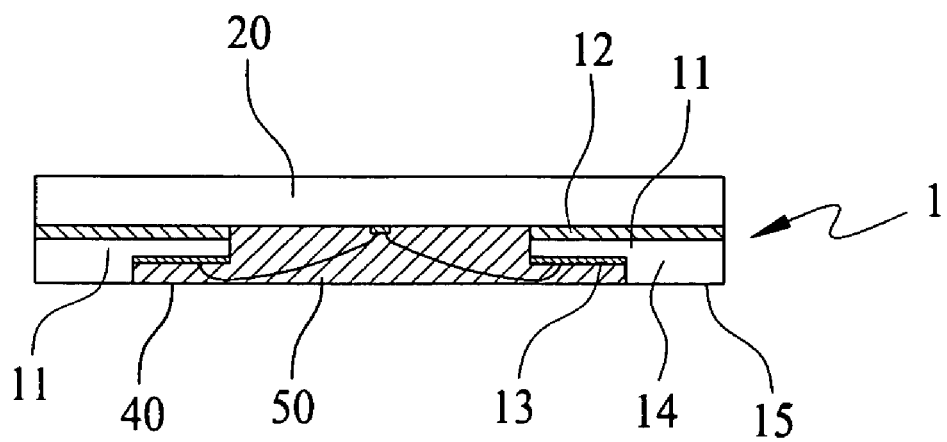
FIG. 3 shows the structure of lead of the current invention formed by pressing from top to bottom.

The structure features and other functions and purposes of this invention will be described in detail along with the embodiments on the attached drawings:

As shown in the attached drawings, the "Concealable chip leadframe unit structure" of the current invention mainly aims at improving the unit structure of the multiple leads 11 (or called connecting pins) of leadframe 1 (or called flower rack), through such improvement, chip 20 can thus be placed above leads 11, and the effect of concealable leadframe 1 and leadframe volume reduction can thus be achieved, its main features of embodiment comprising of:

Leadframe 1, (as shown in FIG. 1 and FIG. 2) comprising of two rows, four rows or other number of rows and locations of metallic lead unit 11 according to actual needs, the leads 11 is piece body formed by press equipment and method to have an upper placement plane 12 (as shown in FIG. 3), it is to be placed or contacted by chip 20; on the lower part surface of the piece body is formed at least one inner conducting plane 13 which can be electrically connected to chip 20 with metallic wire 50 by press method, adjacent to the inner conducting plane 13 is formed at least one down protruding bump 14, at the lower surface of the protruding bump 14 is a conducting plane 15 which can be connected to outside; therefore, a leadframe structure 1 is formed for the current invention wherein the upper placement plane 12 of all leads 11 can be placed at least with one chip 20, and its inner conducting plane 13 can be connected with at least one metallic wire 50 to chip 20 (wire-bonding), and the out-connecting surface 15 of the protruding bump 14 can be soldered to printed circuit board.

Figure 4:
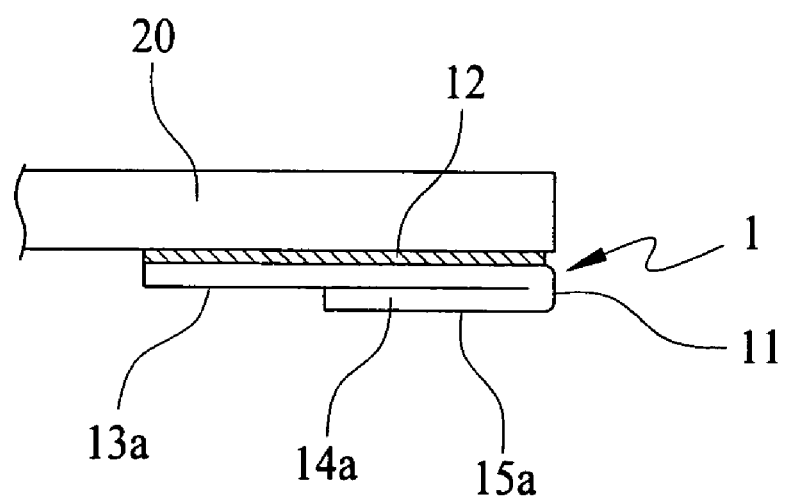
FIG. 4 shows the structure of lead of the current invention formed by pressing, bending and folding.
Figure 5:
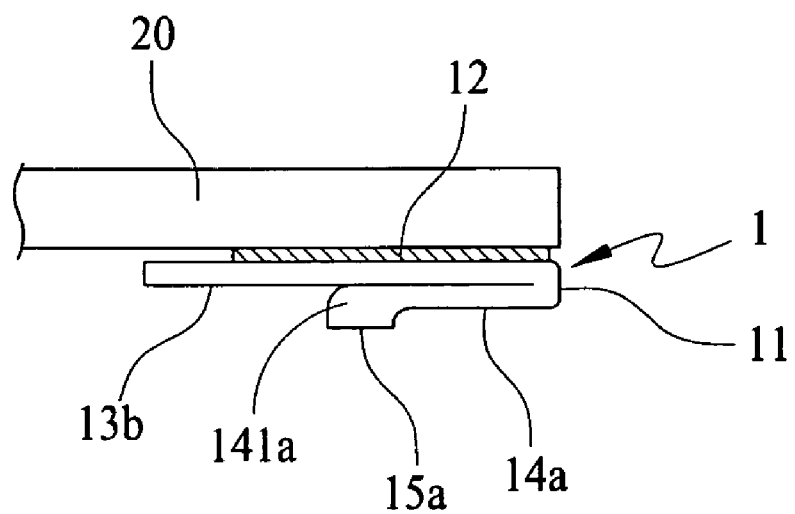
FIG. 5 shows the structure of lead of the current invention containing a bump formed by pressing and bending.
Figure 6:
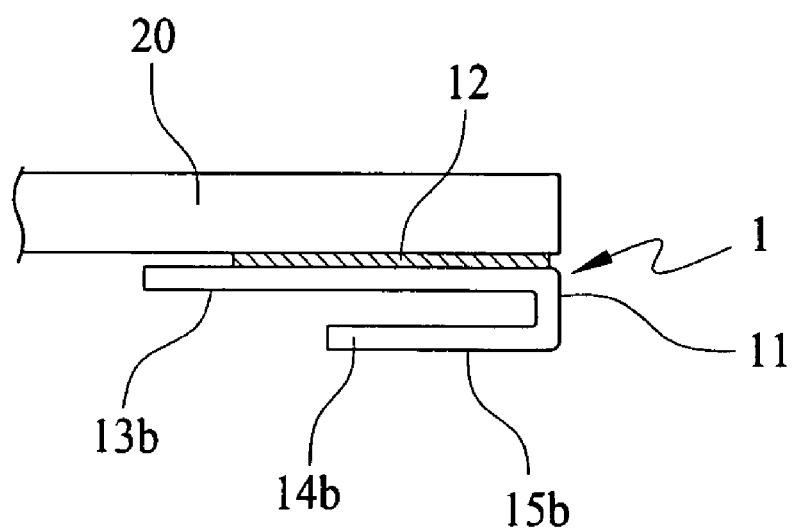
FIG. 6 shows the structure of lead of the current invention formed by pressing, bending and folding.
Figure 7:
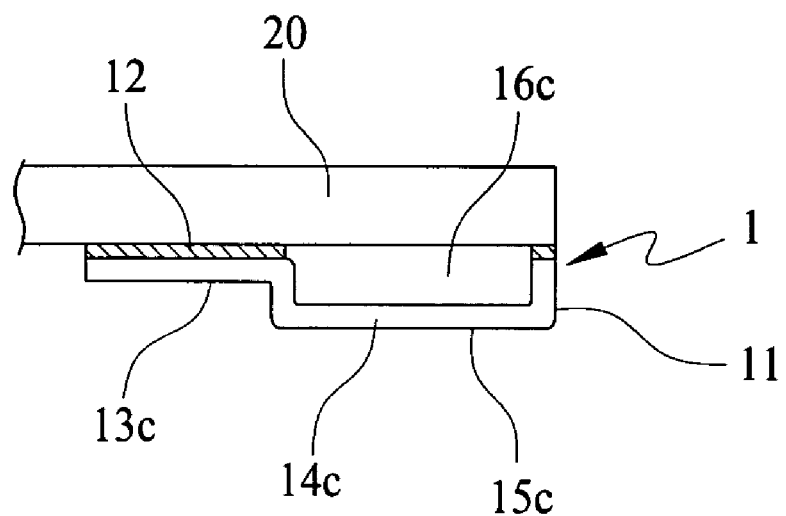
FIG. 7 shows the structure of lead of the current invention formed by pressing from top to bottom.
Figure 8:
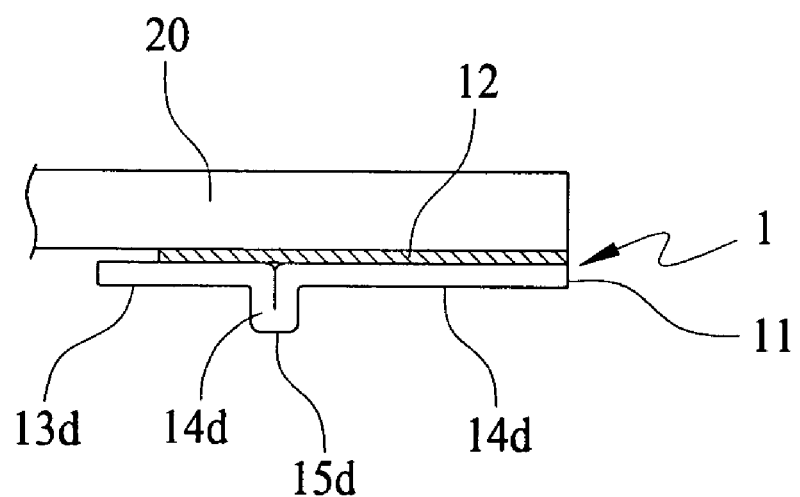
FIG. 8 shows the structure of lead of the current invention formed by squeezing.
Figure 9:
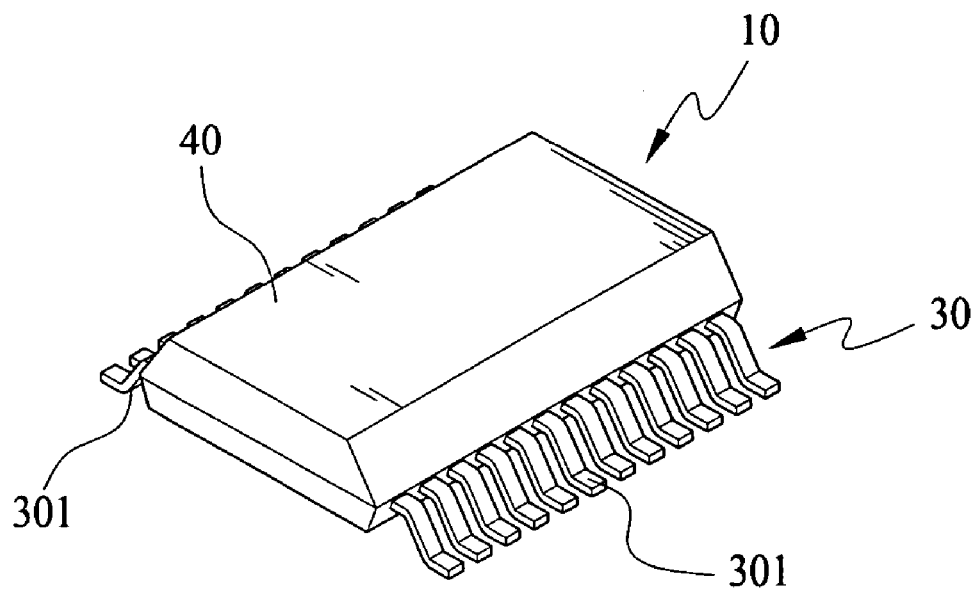
FIG. 9 shows the stereo drawing of prior art semiconductor package structure.
Figure 10:
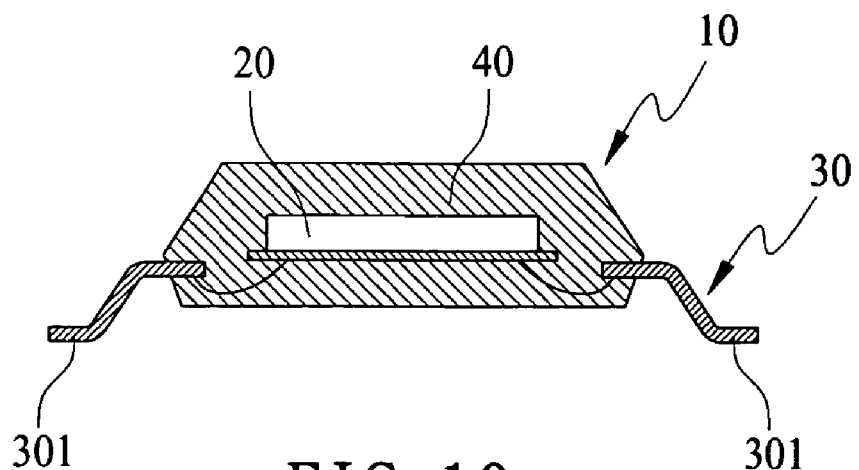
FIG. 10 shows the cross sectional view of prior art semiconductor package structure.

As shown in FIG. 3, leads 11 structure for the current invention can be formed by pressing on a metallic piece body from top to the bottom, a structure with inner conducting plane 13 and at least one protruding bump 14 and outer connecting plane 15 adjacent to it can be easily formed, either two rows or four rows of arrangement can be formed according to actual need, chip 20 can thus be attached to its surface; as shown in FIG. 4, metallic plate (block) can be used in the current invention to form folded structure by pressing action, at least one protruding bump 14a is attached adjacent to the lower inner conducting plane 13a, and the end surface of the protruding bump 14a is used as out-connecting plane 15a; as shown in FIG. 5, through the folding and pressing technology of metallic piece (block) as mentioned above, another embodiment of the current invention is to form a down-curved and folded bump 141a at one end of 14a adjacent to the inner conducting plane 13a, the lower surface of bump 141a can be used as an out-connecting conducting surface 15a; the pressing and bending method used in this invention is not limited to the structure of attaching the protruding bump 14a to the inner conducting surface 13a, as shown in FIG. 6, a gap could be formed between the bended and folded protruding bump 14b and the inner conducting plane 13b such that leadframe 1 can possess enough height, and the lower surface of protruding bump 14b is used as out-connecting conducting plane 15b; furthermore, as shown in FIG. 7, another embodiment is to form downward a dented part 16c by pressing method on the selected upper part of metal plate (block), a protruding bump 14c is formed together in this action, a structure with out-connecting conducting plane 15c and adjacent inner conducting plane 13c at the lower surface is thus formed; furthermore, as shown in FIG. 8, yet another embodiment of the current invention is to squeeze at the lower part a protruding bump 14d on metal plate (block), and a structure feature with an out-connecting conducting plane 15d and adjacent inner conducing plane 13d is thus formed.

From the embodiments disclosed above, we see clearly that leads 11 for the current invention comprising at least one upper placement plane 12, inner conducting plane 13, protruding bump 14 and outer conducting plane 15, etc., it is not limited to any specific technique or measure as long as it can be used to reach the same structure and function, these technique or measure all can be put into embodiment of the current invention; similarly, the above-mentioned inner conducting surface 13, protruding bump 14 and outer connecting plane 15, are not limited to just one or the location as shown in the drawing, there could be two or more protruding bumps 14 and outer connecting plane 15, or the protruding bump 14 and outer connecting plane 15 can be located elsewhere, they could be in staggered arrangement relative to each other such that solder shorting to each other and electromagnetic interference (EMI) can be prevented.

Furthermore, the concealable chip leadframe unit of this invention is to form inner conducting plane 13, which can be connected to chip 20, underneath the leads of leadframe 1, and to form an outer connecting plane 15 which can be connected to device such as printed circuit board, therefore, after chip 20 is placed on the upper placement plane 12 of leadframe 1, leadframe 1 is then concealed underneath chip 20, therefore, whether encapsulated body 40 is used or not to package, the goal of volume reduction of leadframe 1 has been achieved, a compact semiconductor package 10 is thus formed, the trend of compact electronic product is thus matched, especially, the lead length reduction achieved in this invention can lower the resistance and enhance the transfer speed accordingly.

Summarize the above descriptions, current invention of "Concealable chip leadframe unit structure" does possess the required properties of utility and invention, its embodiments are also inventive, we therefore submit a new patent application.

What the invention claimed is:

1. A concealable chip leadframe unit structure comprising a multiple lead structure to provide a body for the attachment of a chip, wherein each lead is a single piece body formed by a pressing method, each lead comprising at least one upper placement plane;

at least one inner conducting plane is formed on the lower end surface of the piece body by a pressing method; and at least one downward protruding bump is formed adjacent to the inner conducting plane, the lower end surface of the protruding bump is used as an outer connecting plane to be connected to outside, wherein the structure is formed wherein the upper placement plane of the leads is configured to be placed against the chip, and the inner conducting plane is configured to be connected to the chip by at least one metallic wire, the outer connecting plane of the protruding bump is configured to be connected to other devices wherein the entire leadframe unit structure underlies the chip.

2. The concealable chip leadframe unit structure of claim 1 wherein said lead, comprising of inner connecting plane, protruding bump and outer connecting bump, is formed by a metallic piece body through a pressing method from top to bottom.

3. The concealable chip leadframe unit structure of claim 1 wherein said lead is formed by metallic plate through a pressing, bending and folding method, a protruding bump is attached adjacent to the inner conducting plane, and the end surface of protruding bump is used as outer connecting plane.

4. The concealable chip leadframe unit structure of claim 1 wherein each of said lead is a structure formed on a selected part of the upper part of the metal plate by a pressing method which presses from top to bottom forms a dented part comprising of protruding bump, the outer connecting plane and the inner connecting plane.

5. The concealable chip leadframe unit structure of claim 1, wherein said lead is a structure formed on the selected metallic plate by a squeezing method, to form the protruding bump on the lower end and the outer and inner conducting planes.

6. The concealable chip leadframe unit structure of claim 3, wherein a new downward bending bump is formed adjacent to the inner conducting plane, the lower end surface of the new downward bending bump is formed as an outer connecting plane.

7. The concealable chip leadframe unit structure of claim 3, further comprising a gap between the protruding bump and the inner conducting plane.

8. The concealable chip leadframe unit structure of claim 1, wherein the outer connecting plane is substantially flush with at least one sidewall of the chip.

* * * * *